United States Patent
Liu et al.

(10) Patent No.: US 11,067,970 B1
(45) Date of Patent: Jul. 20, 2021

(54) METHOD FOR DESIGNING PRODUCTION LINE BASED ON DIGITAL TWIN

(71) Applicant: GUANGDONG UNIVERSITY OF TECHNOLOGY, Guangzhou (CN)

(72) Inventors: Qiang Liu, Guangzhou (CN); Duxi Yan, Guangzhou (CN); Xin Chen, Guangzhou (CN); Lijun Wei, Guangzhou (CN); Jiewu Leng, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/156,622

(22) Filed: Jan. 24, 2021

Related U.S. Application Data

(63) Continuation of application No. PCT/CN2020/142187, filed on Dec. 31, 2020.

(30) Foreign Application Priority Data

Feb. 27, 2020 (CN) .......................... 202010124214.5

(51) Int. Cl.
    *G06G 7/48* (2006.01)
    *G06F 30/20* (2020.01)
    (Continued)

(52) U.S. Cl.
    CPC ..... *G05B 19/41885* (2013.01); *G05B 19/056* (2013.01); *G06F 30/20* (2020.01)

(58) Field of Classification Search
    CPC .............. G06N 20/00; G05B 19/41885; G05B 19/056; G06F 30/20; G06F 8/31;
    (Continued)

(56) References Cited

U.S. PATENT DOCUMENTS

2019/0129408 A1* 5/2019 Celia ................. G05B 23/0297
2019/0137982 A1   5/2019 De et al.
(Continued)

FOREIGN PATENT DOCUMENTS

CN    109343496 A    2/2019
CN    109933035 A    6/2019
(Continued)

OTHER PUBLICATIONS

Nam et al., User Experience- and Design-Oriented Virtual Product Prototyping System, 5 pages (Year: 2019).*

*Primary Examiner* — Thuy Dao
(74) *Attorney, Agent, or Firm* — True Shepherd LLC; Andrew C. Cheng

(57) ABSTRACT

A method for designing a production line based on digital twin (DT), includes: determining a layout strategy of a production line; customizing a DT model of production device based on a pre-built universal DT model; allowing the production device to interact with a virtual model in real time; simultaneously testing and debugging a configuration of the production line; analyzing a test and debug result to derive a defect of the production line; modifying a virtual dynamic model; repeating until an optimal result is generated through optimization and designing the product line according to the optimal result. Based on the realization of virtual and real linkage, the present disclosure performs joint debugging on a physical entity and a virtual model in the production line so as to comprehensively consider uncertainty factors of the device and better guide the modification of the simulation model according to the test result.

5 Claims, 1 Drawing Sheet

(51) Int. Cl.
  *G06F 9/455* (2018.01)
  *G05B 19/418* (2006.01)
  *G05B 19/05* (2006.01)

(58) Field of Classification Search
  CPC ........ G06F 16/00; G06F 16/13; G06F 16/162;
                    G06F 16/164; H04L 63/10
  See application file for complete search history.

(56) References Cited

U.S. PATENT DOCUMENTS

| | | |
|---|---|---|
| 2019/0266295 A1 | 8/2019 | Masuda et al. |
| 2020/0326692 A1 | 10/2020 | Liu et al. |
| 2021/0138651 A1* | 5/2021 | Mcgregor ........ G05B 19/41885 |

FOREIGN PATENT DOCUMENTS

| | | |
|---|---|---|
| CN | 110083119 A | 8/2019 |
| CN | 209879509 U | 12/2019 |
| CN | 111338300 B | 11/2020 |

* cited by examiner

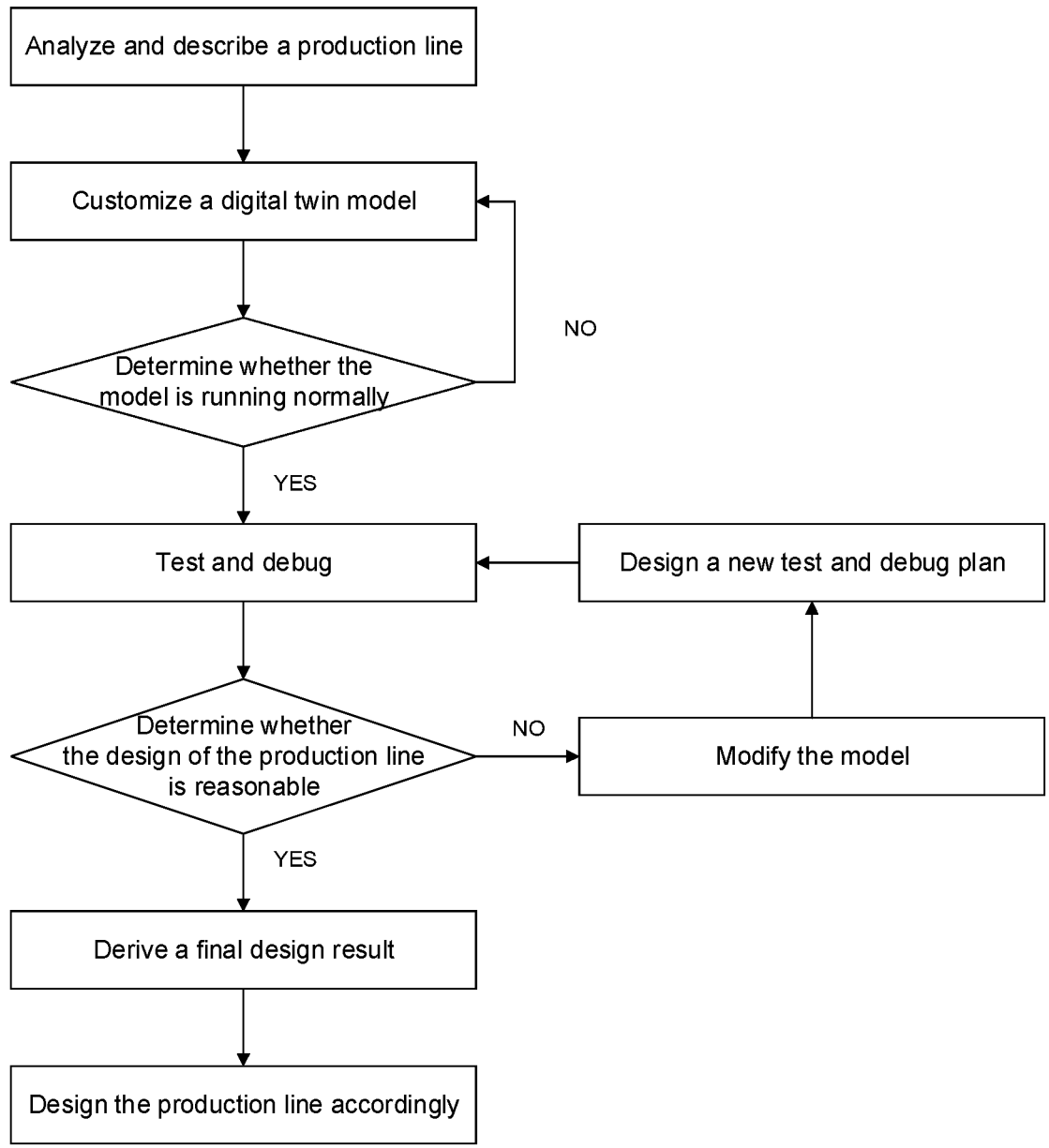

US 11,067,970 B1

METHOD FOR DESIGNING PRODUCTION LINE BASED ON DIGITAL TWIN

CROSS-REFERENCE TO RELATED APPLICATIONS

This application is a continuation of International Patent Application No. PCT/CN2020/142187 with a filing date of Dec. 31, 2020, designating the United States, now pending, and further claims priority to Chinese Patent Application No. 202010124214.5 with a filing date of Feb. 27, 2020. The content of the aforementioned applications, including any intervening amendments thereto, are incorporated herein by reference.

TECHNICAL FIELD

The present disclosure relates to the technical field of production line design, in particular to a method for designing a production line based on digital twin (DT).

BACKGROUND

The existing simulation design technologies focus more on the construction of the physical model of the production line device. They carry out data processing, simulation analysis and virtual verification according to the data in the information space to obtain a preliminary design plan, and then perform multiple design iterations and modify the simulation model to derive a final design result. The existing simulation design technologies mainly have the following deficiencies. (1) The simulation design mainly focuses on the construction of geometric and physical dimensional models of the production device. These models cannot simultaneously reflect the production device's geometric shape, production behavior and various physical changes in the production process. Therefore, simulation based on these models cannot truly describe the production process, resulting in inaccurate simulation design and a need for complicated test and modification before the designed production line is put into use. (2) Some of the existing production line design and simulation methods acquire on-site logistics operation logic, production time and other data to guide the simulation design and verify the result, but the information data and physical data are often separated from each other in the actual implementation process. As a result, it is impossible to make full use of information data to ensure the authenticity, accuracy and reliability of the simulation model and design result to the greatest extent. (3) The lack of consistency and simultaneity between the information and the physical model makes it impossible for joint debugging between the simulation model and the physical entity in the production line. Therefore, it is hard to modify the simulation model and corresponding design parameters properly during the test process in combination with actual production conditions, which further leads to the problem of "imitation but not real" and aggravates the complexity of the design.

SUMMARY

An objective of the present disclosure is to propose a method for designing a production line based on DT. The method includes: configuring a force parameter of a production device and a material, and performing a near-physical simulation to simulate a physical state change process; classifying an problems appeared in simulation, extracting and classifying a physical property of the production device and the material, and generating and storing a series of default configurations.

The present disclosure further proposes a system for designing a production line based on DT. The system includes an analysis module, a production device, a planning module, a physical simulation module, a simulation classification module, a virtual connection module and a model modification module.

To achieve the above purpose, the present disclosure provides the following technical solutions.

A method for designing a production line based on DT includes the following steps:

(1) conducting a systematic analysis of a production line to determine a layout strategy of the production line;

(2) customizing a DT model of a production device in the production line based on a pre-built universal DT model, wherein the step (2) includes the following steps:

(s1) mapping the production device from a physical space to a virtual space;

(s2) acquiring a commonality and an individuality between behaviors of the production device, modifying a control script of the DT model, and planning behaviors of the production device;

(s3) configuring a force parameter of a production device and a material, and performing a near-physical simulation to simulate a physical state change process; classifying problems appeared in simulation, extracting and classifying a physical property of the production device and the material, and generating and storing a series of default configurations;

(3) establishing a communication channel between the production device and a virtual model thereof through a DT technology, so that the production device and the corresponding virtual model interact with each other in real time, and simultaneously running a virtual dynamic model and a physical device in the production line to test and debug a configuration of the production line; and (4) analyzing a test and debug result of step (3) to derive a defect of the production line, modifying the virtual dynamic model, and repeating step (3) until an optimal result is generated through optimization; and designing the product line according to the optimal result.

Further, step (s3) specifically includes the following steps:

(a) analyzing a force of a material and the production device;

(b) deciding whether to simulate a collision between materials according to the force analysis in step (a);

(c) configuring a physical property of the production device: setting a physical entity property, configuring a mass parameter, setting a centroid, configuring a friction coefficient of the production device and setting a collision geometry type;

(d) configuring a physical property of the material: setting angular damping and linear damping, setting an angle factor and a line factor, configuring a mass parameter, setting a centroid and configuring a friction coefficient of the material; and (e) defining a general simulation scenario, classifying problems appeared in simulation, extracting and classifying the physical property of the production device and the material, and generating and storing a series of default configurations of the production line;

Further, the physical state change process includes collision, slip and drop.

Further, in step (s3), a simulation time step is set between step (a) and step (b).

Further, in step (c), the collision geometry type is at least one of a sphere, a cube, a cylinder and a triangle mesh.

Further, the mass parameter configured is a mass ratio of not greater than 1:10 between materials that collide with each other.

Further, step (3) includes: designing a communication data interface of the twin model, configuring programmable logic controller (PLC) output port information of each virtual device, and generating a PLC control port information list of the production line dynamic model; establishing a communication channel between the production device and a virtual model thereof through a DT technology, so that the production device and the corresponding virtual model interact with each other in real time, and simultaneously running a virtual dynamic model and a physical device in the production line to test and debug a configuration of the production line.

A system for designing a production line based on DT includes: an analysis module, a production device, a planning module, a physical simulation module, a simulation classification module, a virtual connection module and a model modification module, where the analysis module is used for conducting a systematic analysis of a production line to determine a layout strategy of the production line;

the production device is used for producing and/or processing a material;

the planning module is used for acquiring a commonality and an individuality between behaviors of the production device, modifying a control script of a DT model, and planning behaviors of the production device;

the physical simulation module is used for configuring a force parameter of the production device and the material, and performing a near-physical simulation to simulate a physical state change process;

the simulation classification module is used for classifying problems appeared in simulation in the physical simulation module, extracting and classifying the physical property of the production device and the material, and generating and storing a series of default configurations;

the virtual connection module is used for establishing a communication channel between the production device and a virtual model thereof through a DT technology, so that the production device and the corresponding virtual model interact with each other in real time, and simultaneously running a virtual dynamic model and a physical device in the production line to test and debug a configuration of the production line; and the model modification module is used for analyzing a test and debug result of the virtual connection module to derive a defect and a simulation of the production line, and modifying the virtual dynamic model.

Further, the physical simulation module includes a force module, a physical property module and a simulation scenario module;

the force module is used for analyzing a force of the material and the production device, dividing a friction in an entire model scenario according to the force analysis, and deciding whether to simulate a collision between materials according to actual needs;

the physical property module is used for configuring a physical property of the production device: setting a physical entity property, configuring a mass parameter, setting a centroid, configuring a friction coefficient of the production device and setting a collision geometry type;

the physical property module is further used for configuring a physical property of the material: setting angular damping and linear damping, setting an angle factor and a line factor, configuring a mass parameter, setting a centroid and configuring a friction coefficient of the material; and the simulation scenario module is used for defining a general simulation scenario, classifying problems appeared in simulation, extracting and classifying the physical property of the production device and the material, and generating and storing a series of default configurations.

Further, the virtual connection module is used for designing a communication data interface of each twin model, configuring PLC output port information of each virtual device, and generating a PLC control port information list of the production line dynamic model; establishing a communication channel between the production device and a virtual model thereof through a DT technology, so that the production device and the corresponding virtual model interact with each other in real time, and simultaneously running a virtual dynamic model and a physical device in the production line to test and debug a configuration of the production line.

The Present Disclosure has the Following Beneficial Effects:

1. The present disclosure changes the relatively independent status of information data and physical model in the traditional production line design and simulation process, and realizes virtual and real linkage.

2. The present disclosure analyzes the commonality of production activities on the production line, and establishes a universal DT model library, which reduces the difficulty of subsequently creating a corresponding DT model and greatly shortens the design cycle.

3. The present disclosure creates the simulation model under the support of a DT technology, which can reflect actual production activities more accurately in real time in multiple dimensions.

4. Based on the realization of virtual and real linkage, the present disclosure performs joint debugging on a physical entity and a virtual model in the production line so as to comprehensively consider uncertainty factors of the device such as real-time operation status, sudden disturbance data and transient abnormal small data. In this way, the present disclosure can better guide the modification of the simulation model according to the test result, reducing the number of model modifications, and obtaining better design results on the premise of shortening the design cycle.

BRIEF DESCRIPTION OF THE DRAWINGS

FIG. 1 is a flowchart of a method for designing a production line according to an embodiment of the disclosure.

DETAILED DESCRIPTION

The technical solutions of the present disclosure are described in more detail below with reference to the accompanying drawings and specific implementations.

Referring to FIG. 1, a method for designing a production line based on DT includes the following steps:

(1) Conduct a systematic analysis of a production line to determine a layout strategy of the production line.

(2) Customize a DT model of a production device in the production line based on a pre-built universal DT model, wherein step (2) includes the following steps:

(s1) Map the production device from a physical space to a virtual space;

(s2) Acquire a commonality and an individuality between behaviors of the production device, modify a control script of the DT model, and plan behaviors of the production device; and (s3) Configure a force parameter of the production device and the material, and perform a near-physical simulation to simulate a physical state change process; classify problems appeared in simulation, extract and classify a physical property of the production device and the material, and generate and store a series of default configurations.

(3) Establish a communication channel between the production device and a virtual model thereof through a DT technology, so that the production device and the corresponding virtual model interact with each other in real time, and simultaneously run a virtual dynamic model and a physical device in the production line to test and debug a configuration of the production line.

(4) Analyze a test and debug result of step (3) to derive a defect of the production line, modify the virtual dynamic model, and repeat step (3) until an optimal result is generated through optimization; and designing the product line according to the optimal result.

The present disclosure changes the relatively independent status of information data and physical model in the traditional production line design and simulation process, and realizes virtual and real linkage.

The present disclosure analyzes the commonality of production activities on the production line, and establishes a universal DT model library, which reduces the difficulty of subsequently creating a corresponding DT model and greatly shortens the design cycle.

The present disclosure creates the simulation model under the support of a DT technology, which can reflect actual production activities more accurately in real time in multiple dimensions.

Based on the realization of virtual and real linkage, the present disclosure performs joint debugging on a physical entity and a virtual model in the production line so as to comprehensively consider uncertainty factors of the device such as real-time operation status, sudden disturbance data and transient abnormal small data. In this way, the present disclosure can better guide the modification of the simulation model according to the test result, reducing the number of model modifications, and obtaining better design results on the premise of shortening the design cycle.

Further, step (s3) includes the following steps:

(a) Analyze a force of the material and the production device.

(b) decide whether to simulate a collision between materials according to the force analysis in step (a).

(c) Configure a physical property of the production device: set a physical entity property, configure a mass parameter, set a centroid, configure a friction coefficient of the production device and set a collision geometry type.

(d) Configure a physical property of the material: set angular damping and linear damping, set an angle factor and a line factor, configure a mass parameter, set a centroid and configure a friction coefficient of the material.

(e) Define a general simulation scenario, classify problems appeared in simulation, extract and classify the physical property of the production device and the material, and generate and store a series of default configurations of the production line.

After analyzing the force of the material and the production device, the present disclosure divides the friction in the model scenario so as to comprehensively consider the overall distribution of the friction and improve the simulation effect of the model. In step b, the present disclosure takes into account the collision between materials and realistically simulates a physical change process including collision, slip and drop, which improves the simulation effect. Based on the collision process, the present disclosure generates a series of default configurations for different types of collision processes in the model. Finally, the present disclosure tests and debugs the configuration of the production line by running the virtual dynamic model and the physical device in the production line. The present disclosure comprehensively considers various situations between the model and the production device, so as to derive the most stable operating state of the production device.

Further, the physical state change process includes collision, slip and drop.

Further, in step (s3), a simulation time step is set between step (a) and step (b).

Further, in step (c), the collision geometry type is at least one of a sphere, a cube, a cylinder and a triangle mesh.

Further, the mass parameter configured is a mass ratio of not greater than 1:10 between materials that collide with each other.

Further, step (3) includes: design a communication data interface of the twin model, configure programmable logic controller (PLC) output port information of each virtual device, and generate a PLC control port information list of the production line dynamic model; establish a communication channel between the production device and a virtual model thereof through a DT technology, so that the production device and the corresponding virtual model interact with each other in real time, and simultaneously run a virtual dynamic model and a physical device in the production line to test and debug a configuration of the production line.

A system for designing a production line based on DT includes an analysis module, a production device, a planning module, a physical simulation module, a simulation classification module, a virtual connection module and a model modification module.

The analysis module is used for conducting a systematic analysis of a production line to determine a layout strategy of the production line.

The production device is used for producing and/or processing a material.

The planning module is used for acquiring a commonality and an individuality between behaviors of the production device, modifying a control script of a DT model, and planning behaviors of the production device.

The physical simulation module is used for configuring a force parameter of the production device and the material, and performing a near-physical simulation to simulate a physical state change process.

The simulation classification module is used for classifying problems appeared in simulation in the physical simulation module, extracting and classifying a physical property of the production device and the material, and generating and storing a series of default configurations.

The virtual connection module is used for establishing a communication channel between the production device and a virtual model thereof through a DT technology, so that the production device and the corresponding virtual model interact with each other in real time, and simultaneously running a virtual dynamic model and a physical device in the production line to test and debug a configuration of the production line.

The model modification module is used for analyzing a test and debug result of the virtual connection module to derive a defect and a simulation of the production line, and modifying the virtual dynamic model.

Further, the physical simulation module includes a force module, a physical property module and a simulation scenario module.

The force module is used for analyzing a force of the material and the production device, dividing a friction in an entire model scenario according to the force analysis, and deciding whether to simulate a collision between materials according to actual needs.

The physical property module is used for configuring a physical property of the production device: setting a physical entity property, configuring a mass parameter, setting a centroid, configuring a friction coefficient of the production device and setting a collision geometry type.

The physical property module is further used for configuring a physical property of the material: setting angular damping and linear damping, setting an angle factor and a line factor, configuring a mass parameter, setting a centroid and configuring a friction coefficient of the material.

The simulation scenario module is used for defining a general simulation scenario, classifying problems appeared in simulation, extracting and classifying the physical property of the production device and the material, and generating and storing a series of default configurations.

Further, the virtual connection module is used for designing a communication data interface of the twin model, configuring PLC output port information of each virtual device, and generating a PLC control port information list of the production line dynamic model; establishing a communication channel between the production device and a virtual model thereof through a DT technology, so that the production device and the corresponding virtual model interact with each other in real time, and simultaneously running a virtual dynamic model and a physical device in the production line to test and debug a configuration of the production line.

Embodiment (1) Preliminary preparation and systematic analysis: Carry out preliminary selection of a device according to a production capacity and a technical plan of a proposed project. A production line is systematically analyzed, and a layout strategy of a production line is initially determined according to many factors such as a material flow of a workshop, an actual site environment, an operating space required by the device and a manufacturing and assembly process flow.

(2) Construction of multi-dimensional dynamic model: Customize a DT model of a corresponding physical device according to a pre-built universal DT model in combination with a specific design requirement of the production line, based on step (1).

(s1) Map geometry of a production device from a physical space to a virtual space.

(s2) Analyze a commonality and an individuality between behaviors of the production device, modify a control script of the DT model, and plan behaviors of the production device.

(s3) Analyze a force of the device and a material, configure parameters such as friction and gravity, and carry out a near-physical simulation to realistically simulate a physical change process including collision, slip and drop.

Specifically:

(a) Analyze a force on the material and the production device (mainly a conveyor), which generally includes gravity or other force such as friction or air resistance.

A reasonable simulation time step is set to reduce or avoid jitter and drift during mutual penetration and simulation between physical entities.

(b) Carry out global configuration of physical property: 1) Set a default friction coefficient: divide a friction of an entire model scenario based on the force analysis in step (a), where an action surface of a secondary friction uses a default friction coefficient. 2) Decide whether to simulate a collision between materials according to actual needs.

(c) Configure a physical property of a conveyor: 1) Set a physical entity property: Set a physical entity property of a conveyor according to a type of the conveyor, for example, generally set a guiding conveyor as a static entity and a lifting conveyor as a rigid body. 2) Configure a mass parameter: Configure a gravity parameter of the conveyor to improve fidelity of the simulation model. For example, when to lift a material, the conveyor needs to overcome its own gravity and material gravity. 3) Set a centroid: necessary if the conveyor is set as a rigid body. 4) Set a friction coefficient: Set a friction coefficient for a contact surface between the conveyor and the material. In particular, for an anisotropic conveyor surface, it is necessary to set a friction coefficient in a direction of material movement and a friction coefficient in other direction, such as a direction orthogonal to the direction of material movement. 5) Set a collision geometry type. The collision geometry mainly includes a sphere, a cube, a cylinder and a triangle mesh, and a variety of collision geometry may be used to approximate a real physical entity, or entity meshing may be used to improve the reality.

(d) Configure a physical property of the material: 1) Set angular damping and linear damping. The conveyor and the material will not remain relatively static in all cases. The material may rotate or slide on the conveyor, and the corresponding angular velocity and linear velocity will decay over time. Therefore, angular damping and linear damping need to be configured in order to improve the fidelity of the model. 2) Set an angle factor and a line factor. 3) Configure a mass parameter. In order to avoid extreme distortion, in principle, the mass ratio between materials that collide with each other does not exceed 1:10. 4) Set a centroid. 5) Configure a friction coefficient.

(e) Define a general simulation scenario, classify problems appeared in simulation, extract and classify the above configuration according to the problem and scenario, and generate a series of default configurations. This facilitates the reuse of the model in a similar scenario and problem and increases the reuse rate of the model.

The virtual assembly of the DT model of the production device is completed, and trial operation and preliminary model modification is conducted.

(3) Test and debug: Design a communication data interface of each twin model, configure PLC output port information of each virtual device, and generate a PLC control port information list of the production line dynamic model; establish a communication channel between the production device and a virtual model thereof through a DT technology, so that the production device and the corresponding virtual model interact with each other in real time; simultaneously run a virtual dynamic model and a physical device in the production line to test and debug a configuration of the production line based on the realization of virtual and real synchronization.

(4) Simulation result analysis and optimization: Demonstrate the rationality of a design result through the test and debug of step (3), so as to find and locate a design defect and a simulation in time; further modify the virtual dynamic model accordingly to make it truly reflect an actual production activity on the production line and improve the design of the production line; design a new test and debug plan, and repeat step (3) to optimize the design result step by step.

Known as "digital mirror" or "digital mapping", digital twin (DT) is a simulation process that integrates multiple disciplines, multiple physical quantities, multiple scales and multiple probabilities by making full use of physical models, sensor updates, operating history and other data. It completes the mapping in a virtual space to reflect the full life cycle process of a corresponding physical device.

A static entity is a physical entity that cannot be moved by applying a force or setting a speed.

A rigid body is a physical entity that has mass and can be moved by applying a force or setting an acceleration and a displacement.

An angle factor represents a coordinate axis around which a rigid body can rotate.

A line factor represents a coordinate direction along which a rigid body can move.

The technical principles of the present disclosure are described above with reference to the specific embodiments. These descriptions are merely intended to explain the principles of the present disclosure, and may not be construed as limiting the protection scope of the present disclosure in any way. Therefore, those skilled in the art may derive other specific implementations of the present disclosure without creative effort, but these implementations should fall within the protection scope of the present disclosure.

What is claimed is:

1. A method for designing a production line based on digital twin (DT), comprising the following steps:
    (1) conducting a systematic analysis of the production line to determine a layout strategy of the production line;
    (2) customizing a DT model of a production device in the production line based on a pre-built universal DT model, wherein step (2) comprises the following steps:
    (s1) mapping the production device from a physical space to a virtual space;
    (s2) acquiring a commonality and an individuality between behaviors of the production device, modifying a control script of the DT model, and planning behaviors of the production device;
    (s3) generating and storing configurations of the production line, which comprises the following steps:
    (a) analyzing a force of a material and the production device;
    (b) deciding whether to simulate a collision between materials according to the force analysis in step (a);
    (c) configuring a physical property of the production device: setting a physical entity property, configuring a mass parameter, setting a centroid, configuring a friction coefficient of the production device and setting a collision geometry type;
    (d) configuring a physical property of the material: setting angular damping and linear damping, setting an angle factor and a line factor, configuring a mass parameter, setting a centroid and configuring a friction coefficient of the material;
    (e) defining a general simulation scenario, classifying problems appeared in simulation, extracting and classifying the physical property of the production device and the material, and generating and storing a series of default configurations of the production line;
    (3) establishing a communication channel between the production device and a virtual model thereof through a DT technology, so that the production device and the corresponding virtual model interact with each other in real time, and simultaneously running a virtual dynamic model and a physical device in the production line to test and debug the default configurations of the production line; and
    (4) analyzing a test and debug result of step (3) to derive a defect the production line, modifying the virtual dynamic model, and repeating step (3) until an optimal result is generated through optimization; and designing the product line according to the optimal result.

2. The method according to claim 1, wherein in step (s3), a simulation time step is set between step (a) and step (b).

3. The method according to claim 1, wherein in step (c), the collision geometry type is at least one of a sphere, a cube, a cylinder and a triangle mesh.

4. The method according to claim 1, wherein the mass parameter configured is a mass ratio of not greater than 1:10 between materials that collide with each other.

5. The method according to claim 1, wherein step (3) comprises: designing a communication data interface of the twin model, configuring programmable logic controller (PLC) output port information of each virtual device, and generating a PLC control port information list of the production line dynamic model; establishing a communication channel between the production device and a virtual model thereof through a DT technology, so that the production device and the corresponding virtual model interact with each other in real time, and simultaneously running a virtual dynamic model and a physical device in the production line to test and debug a configuration of the production line.

\* \* \* \* \*